United States Patent
Park

(10) Patent No.: US 7,128,946 B2
(45) Date of Patent: Oct. 31, 2006

(54) PLATE FOR FORMING METAL WIRES AND METHOD OF FORMING METAL WIRES USING THE SAME

(75) Inventor: Sang Kyun Park, Sungnam-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 424 days.

(21) Appl. No.: 10/617,473

(22) Filed: Jul. 11, 2003

(65) Prior Publication Data

US 2004/0123921 A1 Jul. 1, 2004

(30) Foreign Application Priority Data

Dec. 27, 2002 (KR) ............... 10-2002-0085482
Dec. 27, 2002 (KR) ............... 10-2002-0085483

(51) Int. Cl.
*B05D 1/32* (2006.01)
*B05D 5/00* (2006.01)
*B05D 3/00* (2006.01)

(52) U.S. Cl. .............. 427/282; 427/256; 427/331; 428/596; 428/304.4

(58) Field of Classification Search ......... 148/518; 118/721; 427/331, 355–356, 369, 256, 271, 427/272, 282; 438/945, 612–613, 622, 690, 438/637–640; 428/596, 304.4
See application file for complete search history.

(56) References Cited

U.S. PATENT DOCUMENTS

| 5,858,869 A | * | 1/1999 | Chen et al. | 438/597 |
| 6,100,184 A | * | 8/2000 | Zhao et al. | 438/638 |
| 6,716,754 B1 | * | 4/2004 | Hofmann | 438/690 |
| 2003/0141499 A1 | * | 7/2003 | Venkatraman et al. | 257/40 |

FOREIGN PATENT DOCUMENTS

JP 11-224880 8/1999

* cited by examiner

*Primary Examiner*—Timothy Meeks
*Assistant Examiner*—Cachet I. Sellman
(74) *Attorney, Agent, or Firm*—Marshall, Gerstein & Borun LLP

(57) ABSTRACT

A plate for forming the metal wires has an engraved pattern for forming a plurality of trenches and an engraved pattern for forming a plurality of via holes. An insulating film pattern in which the trenches and the via holes are shaped is obtained using the plate. Also, a metal is buried into the trenches and the via holes by means of a damascene process to form upper metal wires electrically connected to lower metal wires. In the invention, photolithography and etch processes are not employed. For this reason, reduction in the yield and reliability due to defects occurring in the photolithography and etch processes is prevented. Furthermore, the process steps are reduced to reduce the production cost and to improve productivity.

14 Claims, 7 Drawing Sheets

PLATE FOR FORMING METAL WIRES AND METHOD OF FORMING METAL WIRES USING THE SAME

BACKGROUND OF THE INVENTION

1. Field of the Invention

The present invention relates to plate for forming metal wires and method of forming the metal wires using the same, and more particularly, to a plate for forming metal wires and method of forming the metal wires using the same, in which insulating film patterns of a multi-layer structure are shaped by a single process using a plate in which engraved patterns of wire shapes to be formed are formed and in which the metal wires are formed in trenches and via holes formed in the insulating film patterns by means of the damascene process.

2. Background of the Related Art

A conventional method of forming metal wires in the semiconductor device will be now described by reference to FIG. 1A~FIG. 1D.

Referring to FIG. 1A, a bottom low-dielectric insulating film 102 is formed on a silicon substrate 101 for which a given process is implemented. An anti-polishing layer 103 is then formed on the bottom low-dielectric insulating film 102. Next, the anti-polishing layer 103 and the bottom low-dielectric insulating film 102 are patterned to form a trench of a given depth. Thereafter, an anti-diffusion film 104 and a copper film are sequentially formed on the entire structure. The copper film and the anti-diffusion film 104 formed on the anti-polishing layer 103 are then removed by means of a chemical mechanical polishing (CMP) process, so copper wires 105 surrounded by the anti-diffusion film 104 are formed within the trench.

By reference to FIG. 1B, top low-dielectric insulating films 106a~106e of a multi-layer structure are sequentially formed on the entire structure. A mask pattern for forming a via hole 107 is then formed on the top low-dielectric insulating film 106e. Next, the top low-dielectric insulating films 106e~106b are etched by a given depth by means of an etch process using the mask pattern 107 as an etch mask, thus forming a via hole 108. At this time, the top low-dielectric insulating film 106a is used as an etch stop layer.

With reference to FIG. 1C, after the mask pattern 107 is removed, a mask pattern 109 for forming the trench is formed on the top low-dielectric insulating film 106e. The top low-dielectric insulating films 106e and 106d are then etched by means of an etch process using the mask pattern 109 as an etch mask, thereby forming a trench 110. At the same time, remaining top low-dielectric insulating film 106a is etched to complete the via hole 108 so that the copper wires 105 are exposed. At this time, the top low-dielectric insulating film 106c is used as the etch stop layer.

Referring to FIG. 1D, an anti-diffusion film 11 and a copper film (not shown) are sequentially formed on the entire structure including the trench 110 and the via hole 108. The copper film and the anti-diffusion film 11 deposited on the top low-dielectric insulating film 6e are then removed by means of a chemical mechanical polishing (CMP) process, so that copper wires 12 surrounded by the anti-diffusion film 11 is formed within the trench. The copper wires 12 are connected to the copper wires 105 via the via hole 108.

In the conventional method of forming the metal wires of a multi-layer structure using the damascene process, however, there occur several problems due to diffused reflection, flatness of the surface, etc., which are caused by the underlying copper wires during the photolithography process for forming the via hole or the trench. For this reason, there is lots of difficulty in forming a pattern of an ultra-fine size. Furthermore, during the etch process, as the low-dielectric insulating film is lost or the pattern is crumpled, fail is caused. Due to this, in order to form wires of a multi-layer structure, multi-step photolithography and etch processes must be implemented.

SUMMARY OF THE INVENTION

Accordingly, the present invention is contrived to substantially obviate one or more problems due to limitations and disadvantages of the related art.

An object of the present invention is to provide a plate for forming metal wires and method of forming the metal wires using the same, in which an insulating film pattern is shaped by a single process using a plate in which engraved patterns of wire shapes are formed.

Another object of the present invention is to provide a plate for forming metal wires and method of forming the metal wires using the same, in which insulating film patterns of a multi-layer structure are shaped using a plate in which engraved patterns of wire shapes are formed.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a plate for forming metal wires according to one embodiment of the present invention is characterized in that it comprises a plate in which a plurality of implantation holes are formed and a sidewall of a given height is formed at its edge, an engraved pattern for forming a plurality of trenches formed on the plate, and an engraved pattern for forming a plurality of via holes formed on the engraved pattern for forming the trenches.

In another embodiment of the present invention, a plate for forming metal wires is characterized in that it comprises a plate in which a plurality of first and second implantation holes are each formed and a sidewall of a given height is formed at its edge, an engraved pattern for forming a plurality of trenches formed on the plate, and an engraved pattern for forming a plurality of via holes formed on the engraved pattern for forming the trenches.

A method of forming metal wires using a plate according to one embodiment of the present invention is characterized in that it comprises the steps of a) forming a low-dielectric insulating film on a silicon substrate for which given processes are implemented, and then forming a trench in the low-dielectric insulating film; b) forming lower metal wires within the trench; c) adhering a plate in which a plurality of implantation holes are formed and a sidewall of a given height is formed at its edge, an engraved pattern for forming a plurality of trenches formed on the plate, and an engraved pattern for forming a plurality of via holes formed on the engraved pattern for forming the trench, onto a silicon substrate; d) implanting a low-dielectric insulating material through the implantation holes and then annealing the low-dielectric insulating material; e) removing the plate to obtain a low-dielectric insulating film pattern having the plurality of the trenches shaped by the engraved pattern for forming the trenches and the plurality of the via holes shaped by the engraved pattern for forming the via holes; and f) forming upper metal wires, which are connected to the lower metal wires through the via holes, within the trenches.

In another embodiment of the present invention, a method of forming metal wires using a plate is characterized in that it comprises the steps of a) forming a low-dielectric insulating film on a silicon substrate for which given processes are implemented and then forming a trench in the low-dielectric insulating film; b) forming lower metal wires within the trench; c) adhering a plate in which a plurality of first and second implantation holes are each formed and a sidewall of a given height is formed at its edge, an engraved pattern for forming a plurality of trenches formed on the plate, and an engraved pattern for forming a plurality of via holes formed on the engraved pattern for forming the trench, onto a silicon substrate; d) implanting a first insulating material of a given amount through the first implantation hole and then performing a first annealing process; e) implanting a second insulating material through the second implantation hole and then performing a second annealing process; f) removing the plate to obtain an insulating film pattern of a multi-layer structure having the plurality of the trenches shaped by the engraved pattern for forming the trenches and the plurality of the via holes shaped by the engraved pattern for forming the via holes; and g) forming upper metal wires, which are connected to the lower metal wires through the via holes, within the trenches.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 1A:
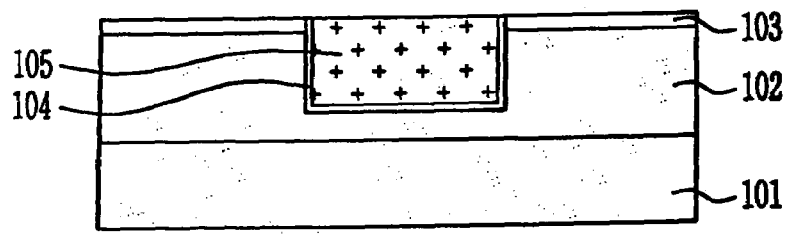
FIG. 1A~FIG. 1D are cross-sectional views of semiconductor devices for explaining a conventional method of forming metal wires in the device.
Figure 1B:
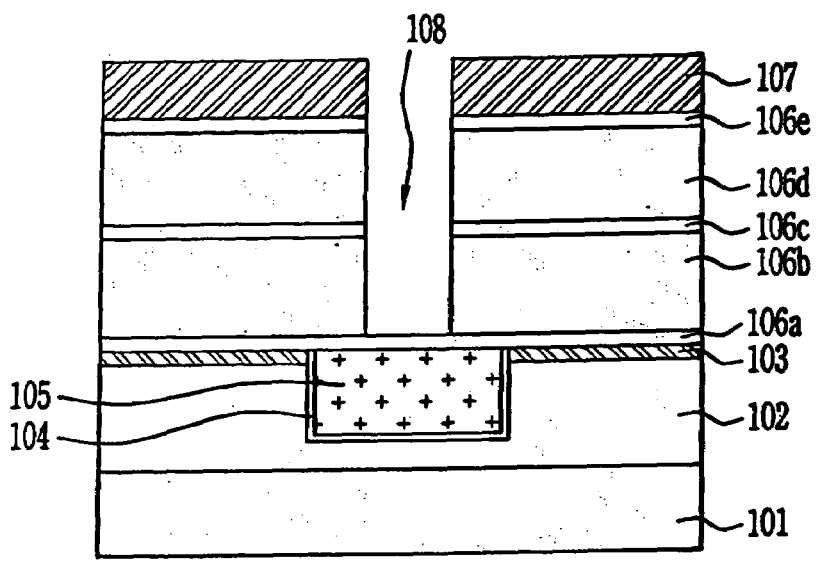
Figure 1C:
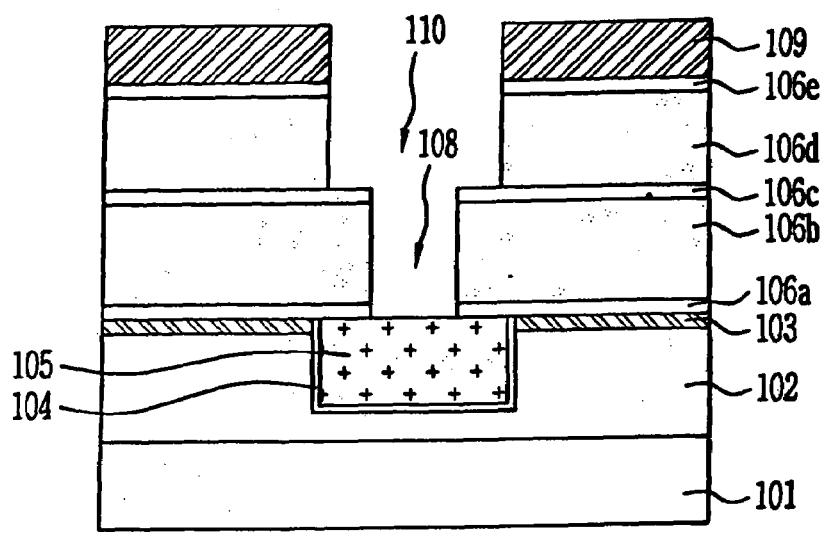
Figure 1D:
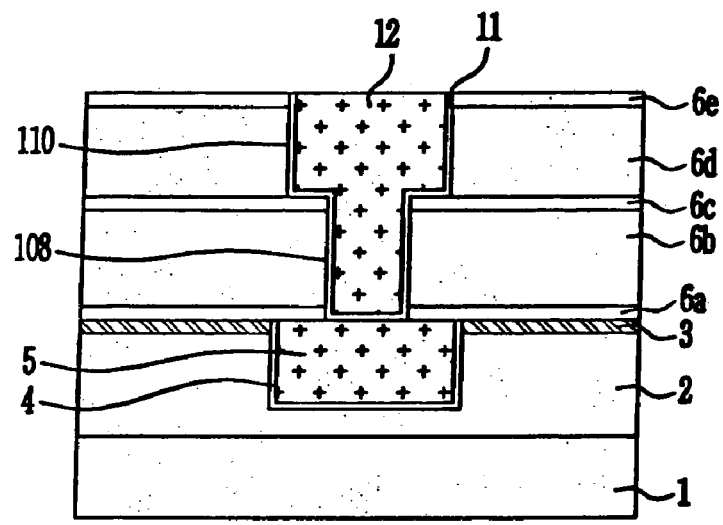
Figure 2:
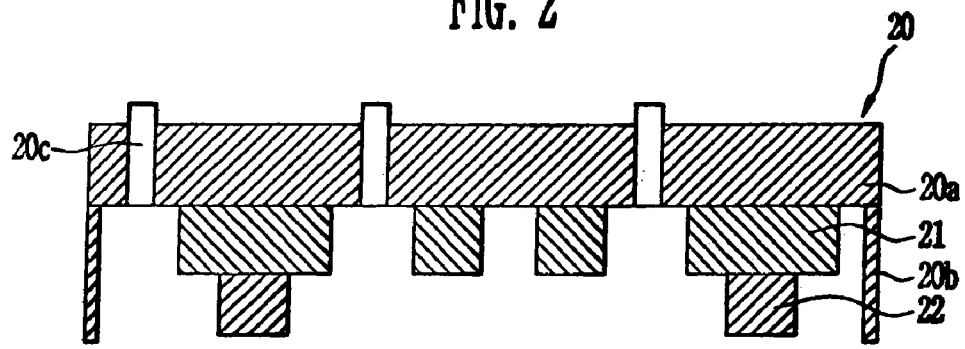
FIG. 2 is a cross-sectional view of a semiconductor device for explaining a plate for forming metal wires according to one embodiment of the present invention.

FIG. 2 is a cross-sectional view of a semiconductor device for explaining a plate for forming metal wires according to one embodiment of the present invention.

The plate for forming the metal wires 20 comprises a circular plate 20a in which a plurality of implantation holes 20c are formed and a sidewall 20b of a give height is formed at its edge, engraved patterns 21 for forming a plurality of trenches formed on the plate 20a, and engraved patterns 22 for forming a plurality of via holes formed on the engraved patterns 21.

The plate for forming the metal wires may be made of a metal having a good abrasion resistance and a high melting point such as Ti, Ta, W, etc., nitrogenous compound of a metal or ceramics such as $Al_2O_3$, etc. The engraved patterns 21 for forming the plurality of the trenches and the engraved patterns 22 for forming the plurality of the via holes may be formed by means of a photolithography process and an etch process or a damascene process. A reactive ion etching (RIE) method is used as the etch process.

FIG. 3A~FIG. 3E illustrate processes of forming the metal wires of the multi-layer structure using the plate for forming the metal wires according to one embodiment of the present invention as in FIG. 2.

Figure 3A:
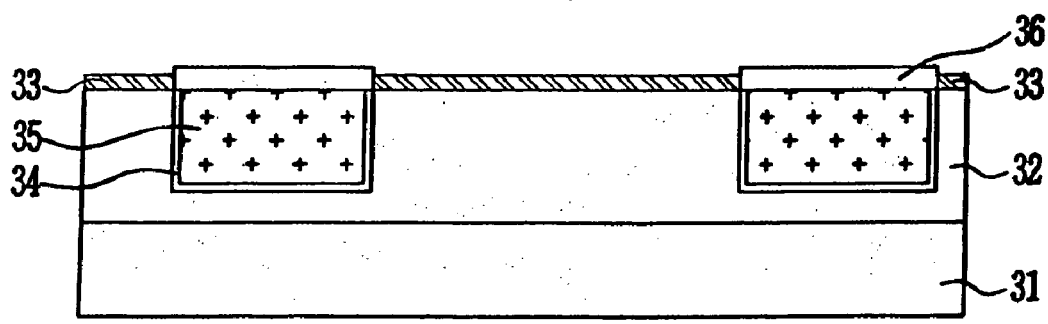
FIG. 3A~FIG. 3E are cross-sectional views of semiconductor devices for explaining a method of forming metal wires using a plate for forming the metal wires according to one embodiment of the present invention.

Referring to FIG. 3A, a bottom low-dielectric insulating film 302 is formed on a silicon substrate 301 for which given processes are implemented. An anti-polishing layer 303 is then formed on the bottom low-dielectric insulating film 302. Next, the anti-polishing layer 303 and the bottom low-dielectric insulating film 302 are patterned to form fine trenches of a given depth. Thereafter, an anti-diffusion film 304 and a copper film 305 are sequentially formed on the entire structure. The copper film 305 and the anti-diffusion film 304 deposited on the anti-polishing layer 303 are removed by means of a chemical mechanical polishing (CMP) process, thus forming a copper wires 305 surrounded by the anti-diffusion film 304 within the trench. Thereafter, an anti-diffusion film 306 is selectively formed on the surface of the copper wires 305. At this time, the anti-diffusion film 306 serves to prevent diffusion of copper (Cu) in a subsequent process to prevent contamination of the substrate or the equipment and also facilitates an electrical contact with the metal wires to be formed on the top.

Figure 3B:
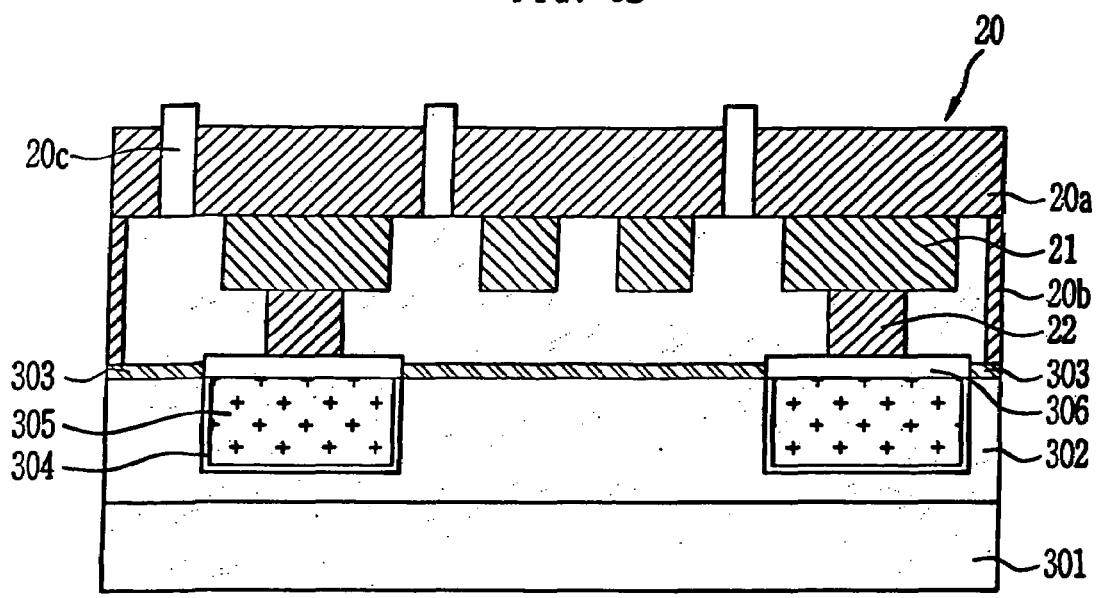

With reference to FIG. 3B, the plate 20 constructed as in FIG. 2 is located on a silicon substrate 301. A proper pressure is applied to the plate 20 so that the sidewall 20b adheres closely to the edge of the silicon substrate 301. Only when the plate 20 and the silicon substrate 301 are completely sealed, a complete contact between the metal wires is accomplished and outside leakage of the insulating film is prevented.

Figure 3C:
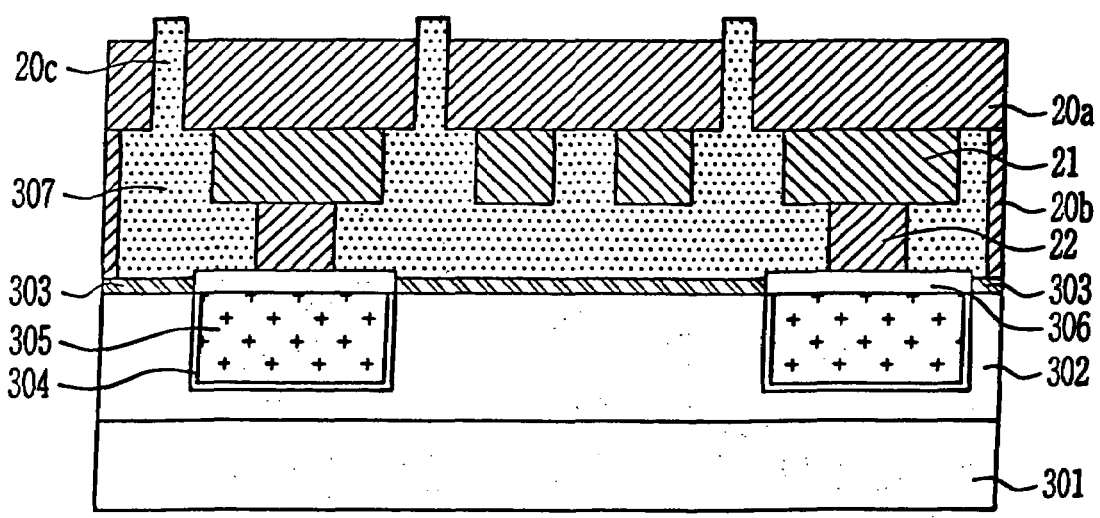

By reference to FIG. 3C, a low-dielectric insulating material 307 of a liquid state or a sol or gel state having a given viscosity is completely injected into the space through the implantation hole 20c. The low-dielectric insulating material 307 injected into the space is then annealed for over 10 seconds, for example 10 seconds~10 minutes so that a solvent contained in the low-dielectric insulating material 307 is removed and the film quality is made dense at the same time. At this time, it is required that the plate 20 and the silicon substrate 301 be kept at a temperature of 100~450° C. A material containing carbon or an organic or inorganic series material of a low density is used as the low-dielectric insulating material 307. It is preferred that the buried thickness is 3000~30000 Å.

Figure 3D:
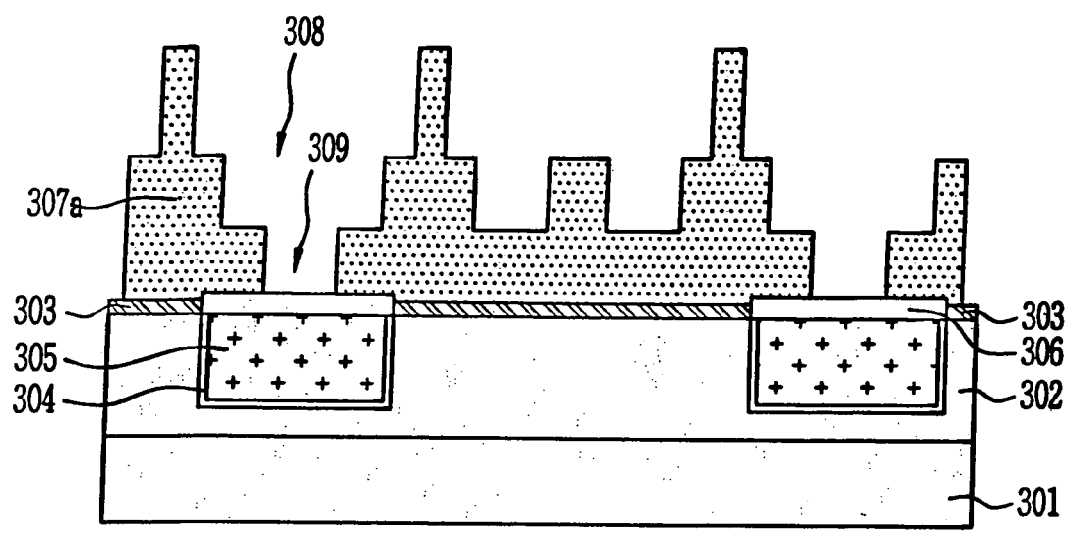

Referring to FIG. 3D, if the plate 20 is separated from the silicon substrate 301, a low-dielectric insulating film pattern 307a having a plurality of trenches 308 shaped by the engraved patterns 21 for forming the plurality of the trenches formed in the plate 20, and a plurality of via holes 309 shaped by the engraved patterns 22 for forming the plurality of the via holes formed in the plate 20.

Figure 3E:
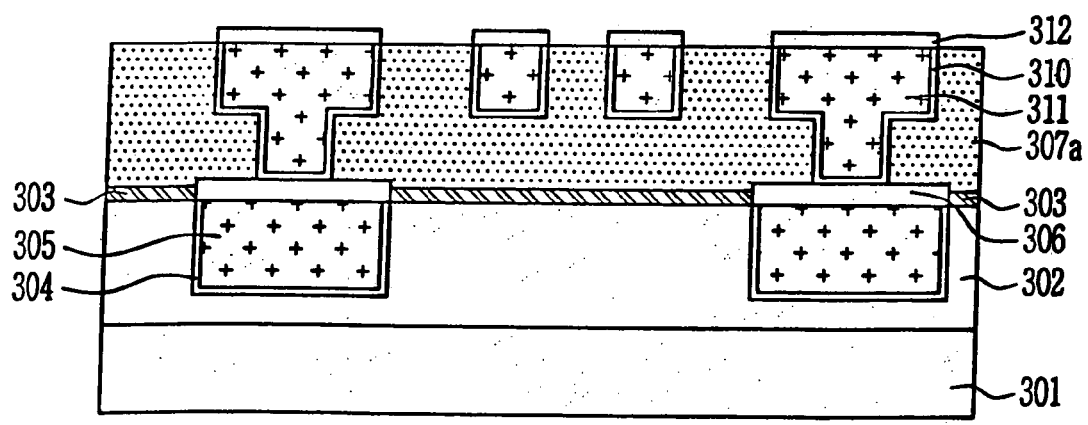

By reference to FIG. 3E, an anti-diffusion film 310 and a copper film 311 are sequentially formed on the entire structure of the low-dielectric insulating film pattern 307a including the trenches 308 and the via holes 309. The copper film 311 and the anti-diffusion film 310 deposited on the low-dielectric insulating film pattern 307a are then removed by a chemical mechanical polishing (CMP) process, so that copper wires 311 surrounded by the anti-diffusion film 310 are formed within the trench 308. At this time, the copper wires 311 on the via hole 309 are electrically connected to the underlying copper wires 305 by means of the anti-diffusion film 310 and the copper film 311 buried in the via hole 309. Thereafter, an anti-diffusion film 312 is selectively formed only on the surface of the copper wires 311.

The anti-diffusion films 304 and 310 are formed in thickness of 0.5~50 nm by depositing Ta, TaN, TiN, TiNSi, WN, WCN or an alloy of their combination by means of a physical vapor deposition (PVD), chemical vapor deposition (CVD) or atomic layer deposition (ALD) method.

The copper films 305 and 311 are formed by depositing copper (Cu) of 200~2000 nm in thickness by means of an electroplating, electroless plating or chemical vapor deposition (CVD) method until the trench is completely buried.

The anti-diffusion films 306 and 312 formed on the surface of the copper wires 305 and 311 may be formed using a high melting point metal such as W, Ti, Ta, etc., or a compound such as Ni, Co, P, B, etc. The anti-diffusion films 306 and 312 of 1~100 nm in thickness may be formed only on the surface of the copper wires 305 and 311 by implementing a selective electroless plating method, etc.

If the processes of FIG. 3B~FIG. 3E are repeatedly implemented, the metal wires of a desired multi-layer structure could be formed.

Figure 4:
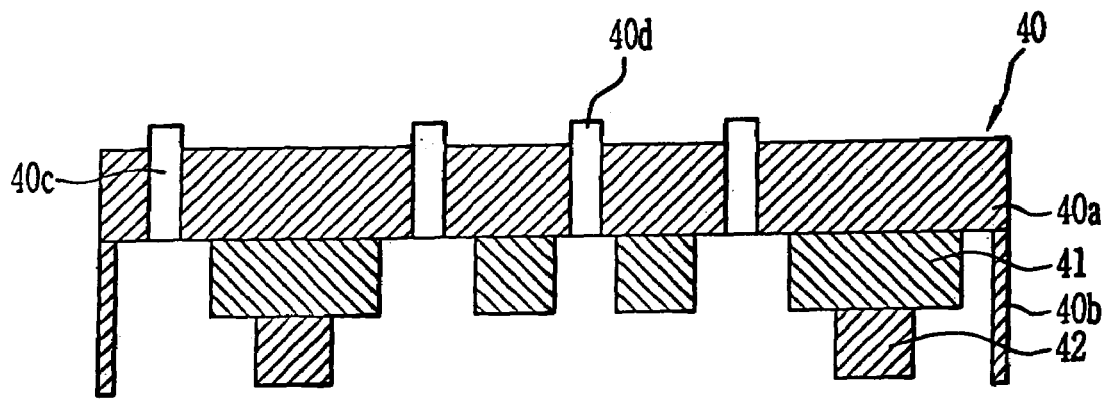
FIG. 4 is a cross-sectional view of a semiconductor device for explaining a plate for forming metal wires according to another embodiment of the present invention.

FIG. 4 is a cross-sectional view of a semiconductor device for explaining a plate for forming metal wires according to another embodiment of the present invention.

The plate for forming the metal wires 40 comprises a circular plate 40a in which first and second implantation holes 40c and 40d are each formed and a sidewall 40b of a give height is formed at its edge, engraved patterns 41 for forming a plurality of trenches formed on the plate 40a, and engraved patterns 42 for forming a plurality of via holes formed on the engraved patterns 41.

The plate for forming the metal wires may be made of a metal having elasticity corresponding to fine curves of the substrate located at the bottom and pressure applied from the top, a good abrasion resistance and a high melting point such as Ti, Ta, W, etc., nitride compound of the metal, or ceramics such as $Al_2O_3$, etc. The first and second implantation holes 40c and 40d are formed with uniform distribution so that the insulating material could be buried in a uniform thickness and must be discriminated so that insulating materials of different kinds could be implanted, respectively. The engraved patterns 41 for forming the plurality of the trenches and the engraved patterns 42 for forming the plurality of the via holes may be formed by means of a photolithography process and an etch process or a damascene process. A reactive ion etching (RIE) method is used as the etch process.

Figure 5A:
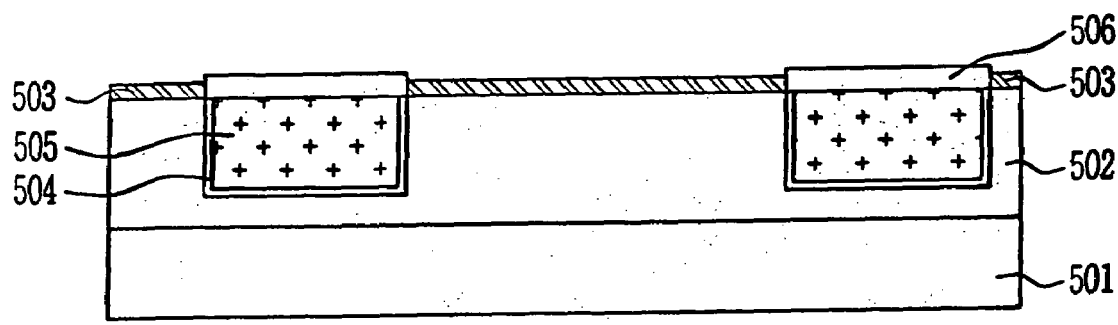
FIG. 5A~FIG. 5F are cross-sectional views of semiconductor devices for explaining a method of forming metal wires using a plate for forming the metal wires according to another embodiment of the present invention.

FIG. 5A~FIG. 5F illustrate processes of forming the metal wires using the plate for forming the metal wires constructed as in FIG. 4 according to another embodiment of the present invention;

Referring to FIG. 5A, a bottom low-dielectric insulating film 502 is formed on a silicon substrate 501 for which given processes are implemented. An anti-polishing layer 503 is then formed on the bottom low-dielectric insulating film 502. Next, the anti-polishing layer 503 and the bottom low-dielectric insulating film 502 are patterned to form fine trenches of a given depth. Thereafter, an anti-diffusion film 504 and a copper film 505 are sequentially formed on the entire structure. The copper film 505 and the anti-diffusion film 504 deposited on the anti-polishing layer 503 are removed by means of a chemical mechanical polishing (CMP) process, thus forming a copper wires 505 surrounded by the anti-diffusion film 504 within the trench. Thereafter, an anti-diffusion film 506 is selectively formed on the surface of the copper wires 505. At this time, the anti-diffusion film 506 serves to prevent diffusion of copper (Cu) in a subsequent process to prevent contamination of the substrate or the equipment and also facilitates an electrical contact with the metal wires to be formed on the top.

Figure 5B:
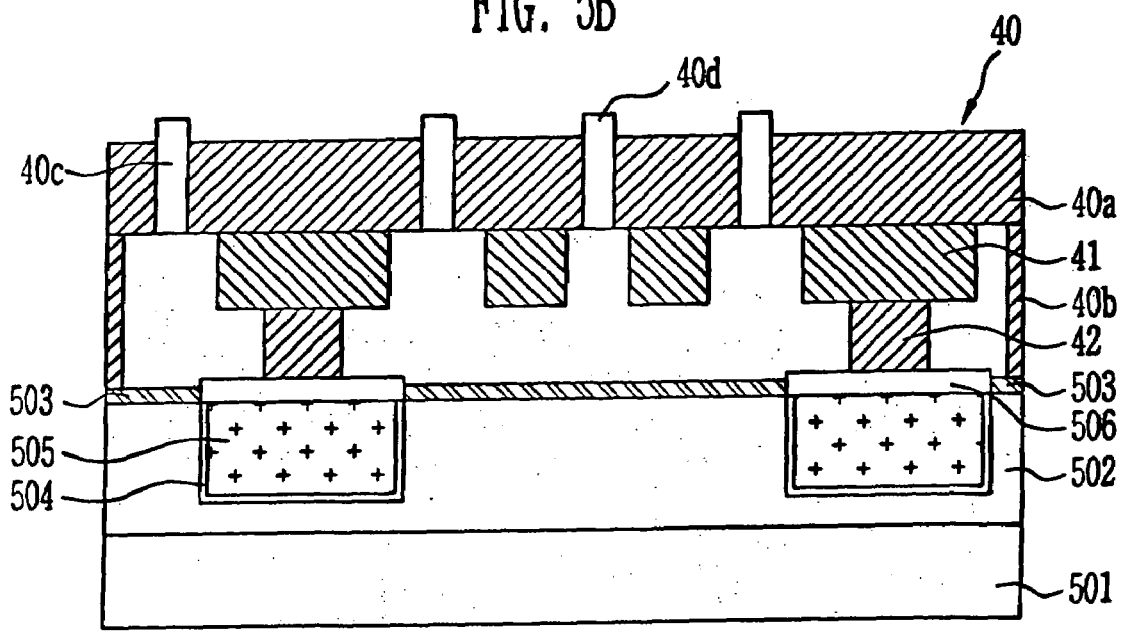

With reference to FIG. 5B, the plate 40 constructed an in FIG. 4 is located on a silicon substrate 501. A proper pressure is applied to the plate 40 so that the sidewall 40b adheres closely to the edge of the silicon substrate 501. Only when the plate 40 and the silicon substrate 501 are completely sealed, a complete contact between the metal wires is accomplished and outside leakage of the insulating film is prevented.

Figure 5C:
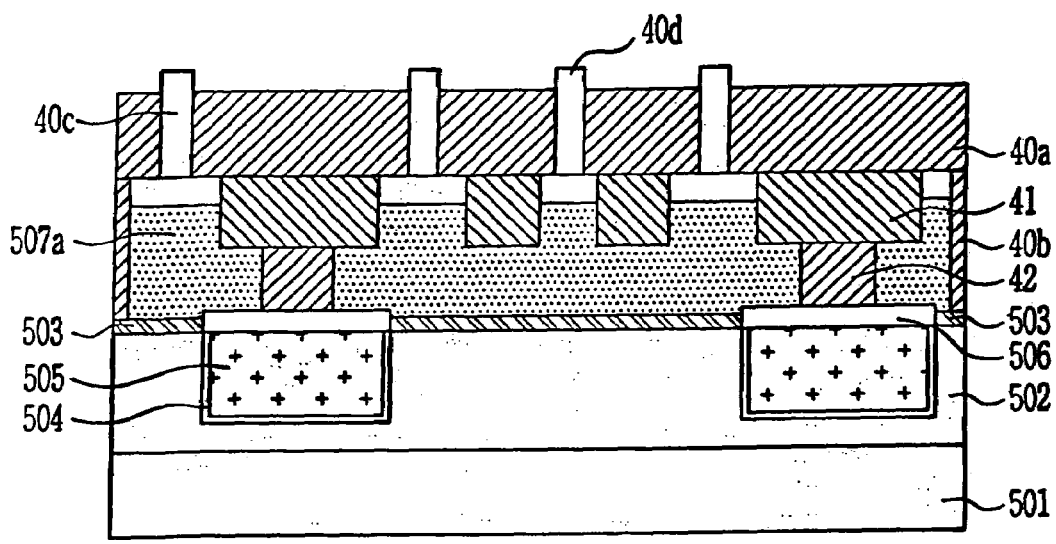

By reference to FIG. 5C, a low-dielectric insulating material 507a of a liquid state or a sol or gel state having a given viscosity is injected by a given thickness through the first implantation hole 40c. The low-dielectric insulating material 507a is then annealed for over 10 seconds, for example 10 seconds~10 minutes under an inert gas atmosphere of over 1 atmospheric pressure so that a solvent contained in the low-dielectric insulating material 507a is removed and the film quality is made dense at the same time. At this time, it is required that the plate 40 and the silicon substrate 501 be kept at a temperature of 100~450° C. A material containing carbon, or organic or inorganic series material of a low density is used as the low-dielectric insulating material 507a. It is preferred that the buried thickness is 3000~30000 Å.

Figure 5D:
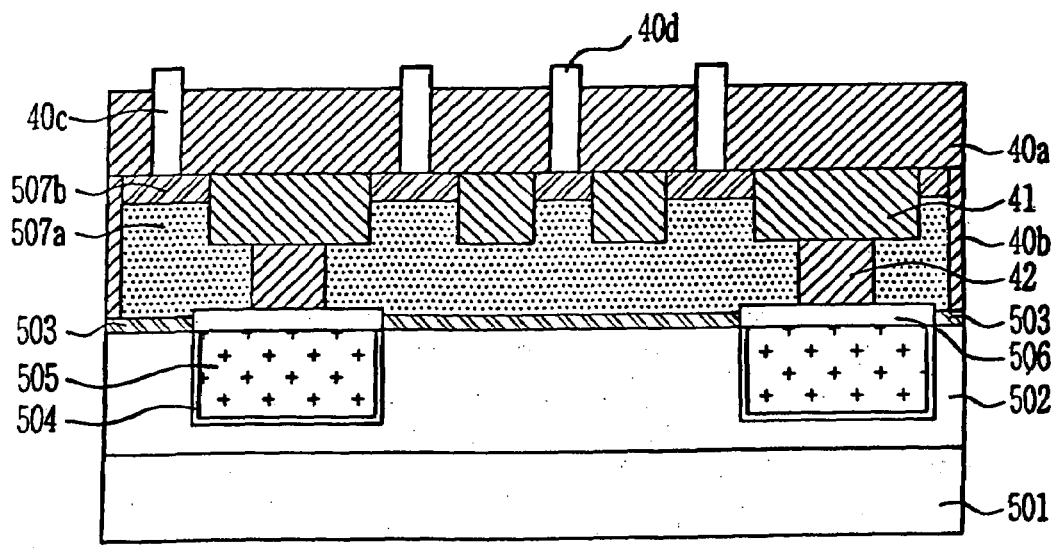

By reference to FIG. 5D, an anti-polishing layer material 507b of a liquid state or a sol or gel state having a given viscosity is injected by a given thickness through the second implantation hole 40d. The anti-polishing layer material 507b is then annealed for over 10 seconds, for example 10 seconds~10 minutes under an inert gas atmosphere of over 1 atmospheric pressure so that a solvent contained in the anti-polishing layer material 507b and the low-dielectric insulating material 507a is removed and the film quality is made dense at the same time. At this time, it is required that the plate 40 and the silicon substrate 501 be kept at a temperature of 100~450° C. An inorganic series material having a dielectric of 2.0~4.5 is used as the anti-polishing layer material 507b.

If contraction occurred in the annealing process for making dense the film quality of the low-dielectric insulating material 507a and the anti-polishing layer material 507b is not applied vertically to the substrate 501, between the engraved pattern 41 for forming the trench and the engraved pattern 42 for forming the via hole in the plate 40 and between the low-dielectric insulating material 507a and the anti-polishing layer material 507b are excessively separated, which makes poor the shape of the pattern. In the present invention, therefore, annealing in FIG. 5C and FIG. 5D is implemented for over 10 seconds under an inert gas atmosphere of over 1 atmospheric pressure, so that a pressure of over 1 atmospheric pressure is anisotropically applied vertically to the substrate 501.

Figure 5E:
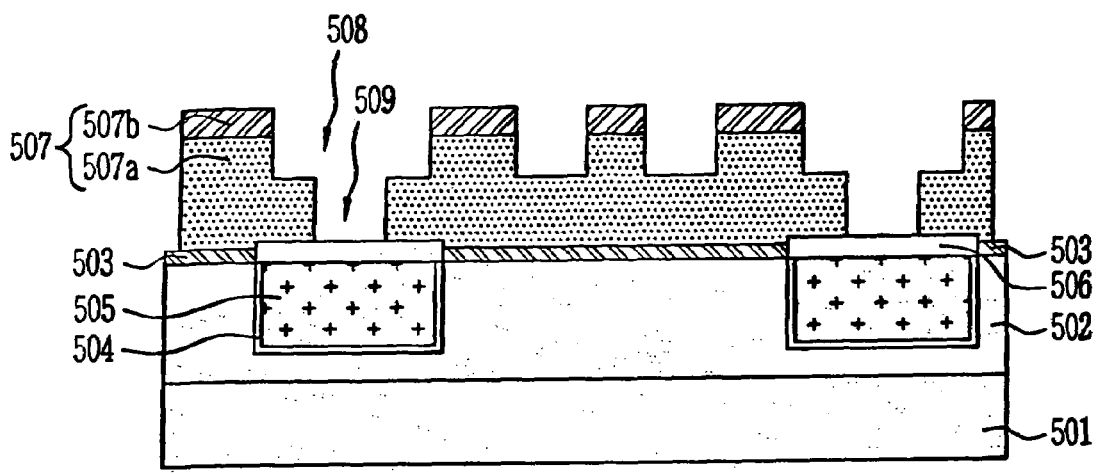

Referring to FIG. 5E, if the plate 40 is separated from the silicon substrate 501, a multi-layer structure having a plurality of trenches 508 shaped by the engraved patterns 41 for forming the plurality of the trenches formed in the plate 40, and a plurality of via holes 509 shaped by the engraved patterns 42 for forming the plurality of the via holes formed in the plate 40, i.e., an insulating film pattern 507 consisting of the low-dielectric insulating film pattern 507*a* and the anti-polishing layer material 507*b* are fabricated.

Figure 5F:
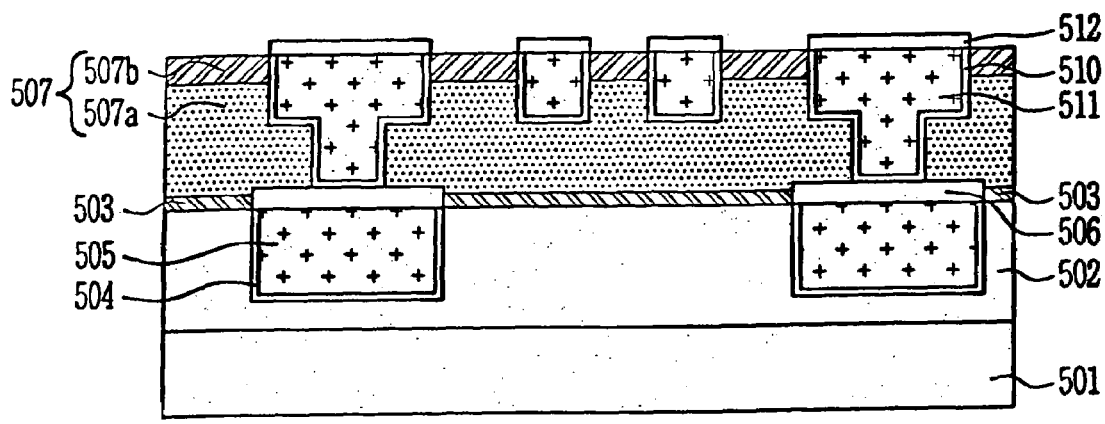

By reference to FIG. 5F, an anti-diffusion film 510 and a copper film 511 are sequentially formed on the entire structure of the insulating film pattern 507 including the trenches 508 and the via holes 509. The copper film 511 and the anti-diffusion film 510 deposited on the insulating film pattern 507 are then removed by a chemical mechanical polishing (CMP) process, so that copper wires 511 surrounded by the anti-diffusion film 510 are formed within the trench 508. At this time, the copper wires 511 on the via hole 509 are electrically connected to the underlying copper wires 505 by means of the anti-diffusion film 510 and the copper film 511 buried in the via hole 509. Thereafter, an anti-diffusion film 512 is selectively formed only on the surface of the copper wires 511.

The anti-diffusion films 504 and 510 are formed in thickness of 0.5~50 μm by depositing Ta, TaN, TiN, TiNSi, WN, WCN or an alloy of them by means of a physical vapor deposition (PVD), chemical vapor deposition (CVD) or atomic layer deposition (ALD) method.

The copper films 505 and 511 are formed by depositing copper (Cu) of 200~2000 nm in thickness by means of an electroplating, electroless plating or chemical vapor deposition (CVD) method until the trench is completely buried.

The anti-diffusion films 506 and 512 formed on the surface of the copper wires 505 and 511 may be formed using a high melting point metal such as W, Ti, Ta, etc., or a compound such as Ni, Co, P, B, etc. The anti-diffusion films 506 and 512 of 1~100 nm in thickness may be formed only on the surface of the copper wires 505 and 511 by implementing a selective electroless plating method, etc.

If the processes of FIG. 5B~FIG. 5F are repeatedly implemented, the metal wires of a desired multi-layer structure could be formed.

As described above, a plate for forming metal wires having an engraved pattern for forming a plurality of trenches and an engraved pattern for forming a plurality of via holes is manufactured. An insulating film pattern of a multi-layer structure in which the trenches and the via holes are shaped is obtained by a single process using the plate. Also, a metal is buried into the trenches and the via holes by means of a damascene process, thereby forming upper metal wires electrically connected to lower metal wires.

Therefore, the present invention has new effects that it can prevent reduction in the yield and reliability due to defects occurring in photolithography and etch processes since the present invention does not employ the photolithography and etch processed, and reduce the production cost and improve the productivity, through reduction of the process steps. Furthermore, if the insulating film pattern is formed using a single material, problems such as low mechanical strength of the insulating film pattern, generation of particles, damage by chemistry, and the like occur in a subsequent metal layer polishing (CMP) process. However, the present invention does not suffer from these conventional problems since the insulating film pattern of a multi-layer structure including the anti-polishing layer is formed.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming metal wires, comprising the steps of:
   a) forming a low-dielectric insulating film on a silicon substrate for which given processes are implemented, and then forming a trench in the low-dielectric insulating film;
   b) forming lower metal wires within the trench;
   c) adhering a plate in which a plurality of implantation holes are formed and a sidewall of a given height is formed at its edge, an engraved pattern for forming a plurality of trenches formed on the plate, and an engraved pattern for forming a plurality of via holes formed on the engraved pattern for forming the trench, onto a silicon substrate;
   d) injecting a low-dielectric insulating material of a liquid state or a sol or gel state completely into a space through the implantation holes and then annealing the low-dielectric insulating material;
   e) removing the plate to obtain a low-dielectric insulating film pattern having the plurality of the trenches shaped by the engraved pattern for forming the trenches and the plurality of the via holes shaped by the engraved pattern for forming the via holes; and
   f) forming upper metal wires, which are connected to the lower metal wires through the via holes, within the trenches.

2. The method as claimed in claim 1, further comprising the step of forming an anti-diffusion film on the surface of the lower metal wires from the step b).

3. The method as claimed in claim 2, wherein the anti-diffusion film is made of a metal of a high melting point or a compound that contains Ni, Co, P or B, and is formed by a selective electroless plating method.

4. The method as claimed in claim 1, wherein in the step d), the silicon substrate and the plate are kept at a temperature of 100~450° C.

5. The method as claimed in claim 1, wherein the low-dielectric insulating material is made of a material containing carbon or an organic or inorganic series material of a low density and is implanted in thickness of 3000~30000 Å.

6. The method as claimed in claim 1, wherein the annealing process is implemented for 10 seconds~10 minutes.

7. The method as claimed in claim 1, further comprising the step of forming an anti-diffusion film on the surface of the upper metal wires from the step f).

8. The method as claimed in claim 1, wherein the upper and lower metal wires consist of an anti-diffusion film and a copper film, and is formed by a damascene process.

9. The method as claimed in claim 8, wherein the anti-diffusion film is made of Ta, TaN, TiN, TiNSi, WN, WCN, or an alloy of their combination, and is formed by a physical vapor deposition method, a chemical vapor deposition method or an atomic layer deposition method.

10. The method as claimed in claim 8, wherein the copper film is formed by electroplating, electroless plating or chemical vapor deposition method.

11. A method of forming metal wires, comprising the steps of:

a) forming a low-dielectric insulating film on a silicon substrate for which given processes are implemented and then forming a trench in the low-dielectric insulating film;

b) forming lower metal wires within the trench;

c) adhering a plate in which a plurality of first and second implantation holes are each formed and a sidewall of a given height is formed at its edge, an engraved pattern for forming a plurality of trenches formed on the plate, and an engraved pattern for forming a plurality of via holes formed on the engraved pattern for forming the trench, onto a silicon substrate;

d) injecting a first insulating material of a liquid state or a sol or gel state of a given amount through the first implantation hole and then performing a first annealing process;

e) injecting a second insulating material of a liquid state or a sol or gel state through the second implantation hole and then performing a second annealing process;

f) removing the plate to obtain an insulating film pattern of a multi-layer structure having the plurality of the trenches shaped by the engraved pattern for forming the trenches and the plurality of the via holes shaped by the engraved pattern for forming the via holes; and g) forming upper metal wires, which are connected to the lower metal wires through the via hole, within the trenches.

12. The method as claimed in claim 11, wherein the second insulating material is made of an inorganic series material having a dielectric of 2.0~4.5 capable of serving as an anti-polishing layer.

13. The method as claimed in claim 11, wherein the first annealing process in the step d) is implemented for 10 seconds~10 minutes under an inert gas atmosphere of over 1 atmospheric pressure.

14. The method as claimed in claim 11, wherein the second annealing process in the step e) is implemented for 10 seconds~10 minutes under an inert gas atmosphere of over 1 atmospheric pressure.

* * * * *